United States Patent [19]

Takano et al.

[11] 4,276,114
[45] Jun. 30, 1981

[54] SEMICONDUCTOR SUBSTRATE AND A MANUFACTURING METHOD THEREOF

[75] Inventors: Yukio Takano, Kodaira; Masahiko Ogirima, Tokyo; Shigeru Aoki; Michiyoshi Maki, both of Hachioji; Shigeo Kato, Mitaka, all of Japan

[73] Assignee: Hitachi, Ltd., Tokyo, Japan

[21] Appl. No.: 9,967

[22] Filed: Feb. 6, 1979

[30] Foreign Application Priority Data

Feb. 20, 1978 [JP] Japan ................. 53-18260

[51] Int. Cl.³ .............................. H01L 21/304
[52] U.S. Cl. ................... 156/645; 148/1.5; 156/636; 428/409; 428/446
[58] Field of Search ............. 156/645, 636; 428/446, 428/409; 148/1.5

[56] References Cited

U.S. PATENT DOCUMENTS

| | | | |
|---|---|---|---|
| 3,009,841 | 11/1961 | Faust | 156/636 |
| 3,041,226 | 6/1962 | Pennington | 156/645 |
| 3,128,213 | 4/1964 | Gault | 156/645 |
| 3,266,961 | 8/1966 | Emels | 156/645 |
| 3,342,652 | 9/1967 | Reisman | 156/636 |
| 3,436,286 | 4/1969 | Lange | 156/636 |
| 3,615,955 | 10/1971 | Regh | 156/645 |
| 3,888,053 | 6/1975 | White | 156/636 |
| 3,923,567 | 12/1975 | Lawrence | 156/645 |
| 4,144,099 | 3/1979 | Edmonds | 156/645 |

Primary Examiner—Ellis P. Robinson
Attorney, Agent, or Firm—Craig and Antonelli

[57] ABSTRACT

This invention relates to a semiconductor substrate and a method of manufacturing the same. In a semiconductor manufacturing process for a Si single crystal wafer or the like, before the step of mirror polishing, the rear surface of a Si wafer is ground to form a damaged layer having a certain fixed thickness, the Si wafer is subsequently etched by chemical etching if desired, and the rear surface is further formed with an oxide film by thermal oxidation if desired, whereby a semiconductor substrate exhibiting an intense gettering effect is manufactured.

11 Claims, 10 Drawing Figures

SEMICONDUCTOR SUBSTRATE AND A MANUFACTURING METHOD THEREOF

BACKGROUND OF THE INVENTION

This invention relates to a semiconductor substrate and a method of manufacturing the same. The "semiconductor substrate" in this invention shall generally term a semiconductor wafer which has been cut out of a semiconductor crystal rod; a semiconductor device substrate which has become a device substrate for a single semiconductor device, a semiconductor integrated circuit or the like in such a way that after fabricating semiconductor devices on the semiconductor wafer (of course, a case of providing an epitaxial layer on the wafer and forming semiconductor devices in the epitaxial layer is naturally included), the wafer has been split into chips; etc.

In general, the epitaxial layers of silicon (Si) etc. exhibit inferior qualities of crystals, which form a major cause for lowering the manufacturing yield of devices. In order to reduce crystal defects in the epitaxial layer and to attain a good crystal quality, it is necessary to lessen contamination with heavy metals from outside, especially from a gaseous system, and to use a semiconductor substrate material such as Si having a small number of crystal defects. Further, the gettering process is important by which heavy metals or crystal defects originally existent inside the substrate are collected to a part not used for a device, for example, the rear surface of the substrate.

Ordinarily, the gettering is carried out by methods (1) wherein an impurity is diffused into the rear surface of a wafer, (2) wherein a high-density crystal defect layer is formed by implantation at a high density, (3) a damaged layer is formed in the rear surface by a mechanical working such as lapping, etc. Since, however, the methods (1) and (2) are conducted in the processes for manufacturing semiconductor devices after having purchased the semiconductor wafers of Si etc., one step increases, which unfavorably leads to a high cost. Regarding the method (3), there are such disadvantages that the control of the thickness of the damaged layer is difficult and that the damaged layer disappears mostly due to one heat-treatment in the process for manufacturing a semiconductor device, so the gettering effect is weak.

SUMMARY OF THE INVENTION

This invention has for its object to eliminate these disadvantages and to provide a semiconductor substrate formed in its rear surface with a damaged layer of a fixed thickness exhibiting an intense gettering effect, as well as a method of manufacturing the same.

In order to accomplish the object, according to this invention, in semiconductor manufacturing processes for a silicon single crystal wafer etc., before the step of polishing, the rear surface of a Si wafer is ground to form a damaged layer, the Si wafer is subsequently etched by chemical etching if desired, and an oxidation film is further formed on the rear surface by thermal oxidation if desired.

DETAILED DESCRIPTION OF THE PREFERRED EMBODIMENTS

Hereunder, this invention will be described in detail with reference to embodiments.

This invention consists in manufacturing a semiconductor substrate which has a damaged layer based on grinding in its rear surface in such a way that before the step of polishing in semiconductor manufacturing processes for a silicon single crystal wafer etc., the rear surface of a Si wafer is ground to form a damaged layer, the Si wafer being subsequently etched by chemical etching if desired, an oxide film being further formed on the rear surface by thermal oxidation if desired.

Figure 1:
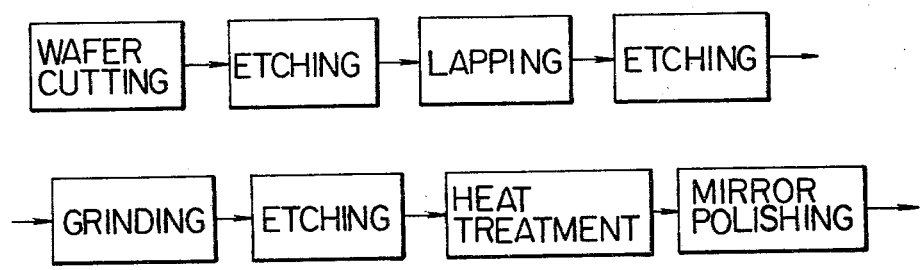
FIG. 1 is a flow diagram showing a process for manufacturing a silicon wafer according to this invention.

FIG. 1 is a process flow diagram showing an example of the manufacture. Referring to the figure, after cutting a Si crystal rod into the shape of a wafer, (1) in order to remove a damaged layer attributed to the cutting, both the surfaces of the wafer were etched, (2) both the surfaces were lapped with suitable grains to eliminate undulations of the wafer, (3) both the surfaces with the lapped damaged layers were etched with the same etchant as in the aforecited etching, (4) the rear surface of the wafer was subjected to grinding to form a damaged layer, (5) both the surfaces were etched, (6) both the surfaces of the wafer were subjected to a thermal oxidation treatment, and (7) the front surface was subjected to mirror polishing to fabricate the substrate.

Figure 2:
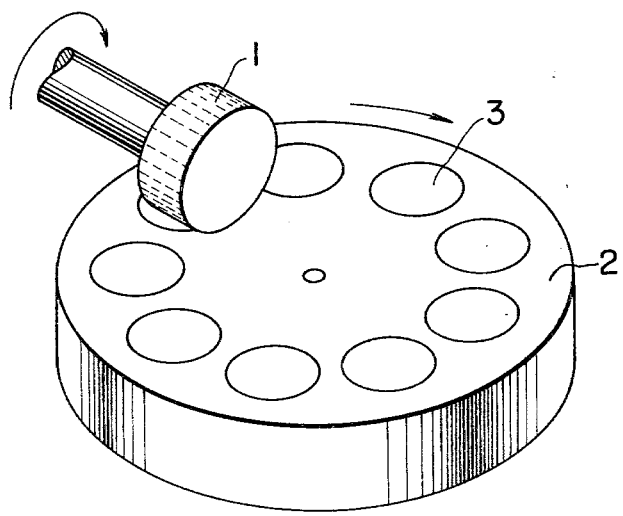
FIG. 2 is a schematic view showing an example of surface grinding equipment.

The grinding was carried out with the plane or surface grinding method. FIG. 2 is a schematic view showing an example of surface grinding equipment. A grinding wheel or grindstone 1 is rotated at high speed, and simultaneously, wafers 3 fixed on a rotary table 2 are rotated, whereby the surfaces of the wafers are removed as fine swarf by grains on the grinding face of the grindstone. Examples of the grinding conditions are indicated in the following table:

| | |
|---|---|
| Grindstone | Diameter: 250 mm, Width: 20 mm, Rotation Speed: 2,000 rpm |
| Grain size | #400, #800, #1000, #1200 |
| thickness of Grinding | 30 μm |
| Depth of Cut | Standard 3 μm/1 pass |
| Table Feed | 3"/min. |
| Speed of Revolutions | 20 rpm |

| Grindstone | Diameter: 250 mm, Width: 20 mm, Rotation Speed: 2,000 rpm |
|---|---|
| of Table | |

In the above table, e.g. #400 indicative of the grain size is Japan Industrial Standard (JIS) #400, and it signifies the size of grains sieved or screened through 400 meshes in each of the vertical and horizontal directions per inch. This invention is not restricted to the illustrated example of the grinding.

An epitaxial layer was grown on the front surface of the Si wafer whose rear surface has been ground, and the gettering effect of a ground damaged layer on minute defects was investigated.

Figure 3:
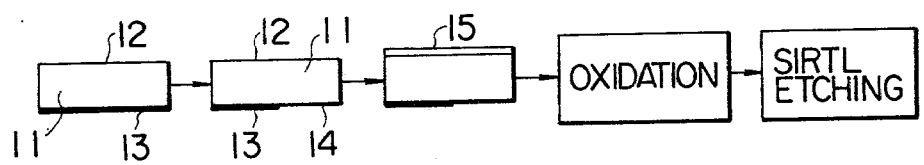
FIG. 3 is a flow diagram showing the process of an experiment for explaining an effect of this invention.

FIG. 3 illustrates a measuring method for the investigation. A sample 11 was a Si wafer which was prepared by the method of this invention (the thickness of the damaged layer was changed variously) and which had one mirror surface 12 and one ground surface 13. (1) The ground damaged layer was partly removed by etching (removed area 14), (2) an epitaxial layer 15 was grown on the mirror surface side, (3) both the surfaces of the wafer were subjected to an oxidation treatment, and (4) the number of crystal defects having developed in the epitaxial layer was measured with the etching method.

The Si wafer mentioned above was prepared in accordance with the previously-stated steps of this invention in such a way that, after cutting a silicon (Si) crystal rod into the shape of a wafer (wafer thickness: 500 μm), (1) both the surfaces were etched with a mixed solution consisting of nitric acid, fluoric acid and glacial acetic acid in order to remove damaged layers ascribable to the cutting, (2) both the surfaces being lapped with grains of #1200 to eliminate undulations of the wafer, (3) the lapped damaged layers of both the surfaces being etched with the above-mentioned etchant, (4) the rear surface of the wafer being shaven off 10 μm by the grinding method, (5) both the surfaces being etched 0.5 μm with an alkaline etchant, (6) both the surfaces of the wafer being subjected to a heat treatment for oxidation (at 1,000° C. for 80 minutes), (7) the front surface being subjected to mirror polishing.

The epitaxial growth was carried out by the chemical vapor deposition method with $SiCl_4$, the growth temperature was 1,150° C., and the thickness of the grown film was 2 μm. The oxidizing heat treatment was conducted at 1,100° C. in a wet atmosphere for 2 hours. The etching for detecting the crystal defects employed the Sirtl etchant (a mixed solution consisting of 50 g of $CrO_3$, 100 cc of HF and 100 cc of $H_2O$), and the etching time was 90 seconds.

Figure 4:
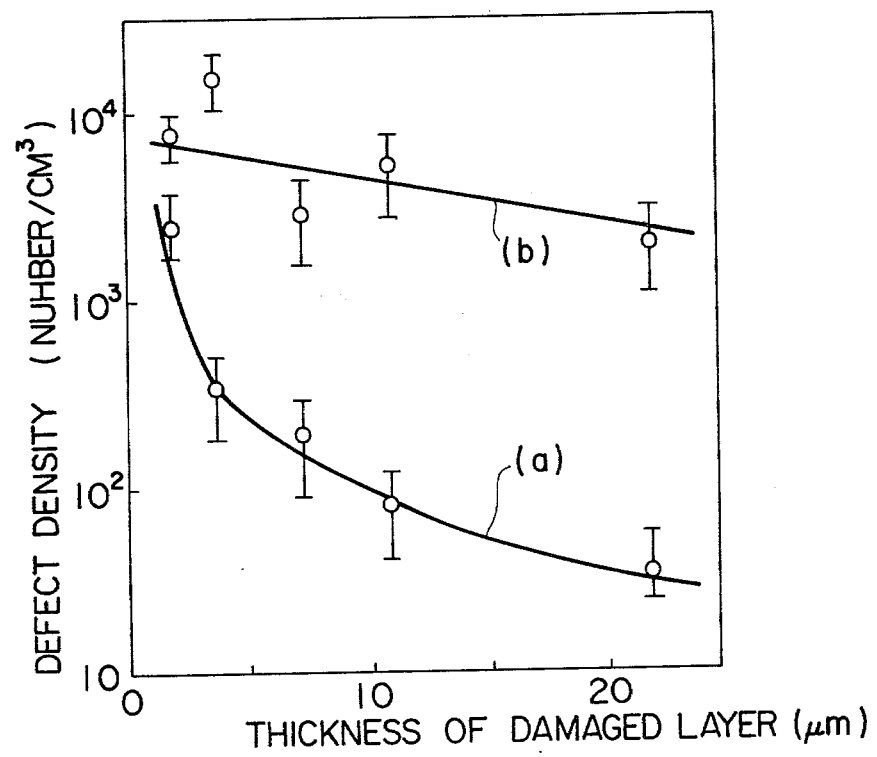
FIG. 4 is a graph showing the results of the experiment for explaining the effect of this invention.

FIG. 4 illustrates by comparison the defect density (a) of the epitaxial layer on that area of the rear surface in which the ground damaged layer was existent, and the defect density (b) of the epitaxial layer on the area in which the ground damaged layer was etched. A large number of crystal defects appear in the epitaxial layer on the area in which the ground damaged layer of the rear surface was removed, while the defect density of the area in which the ground damaged layer existed is lower than in the former case. The lowering proportion is greater as the damaged layer is thicker. In case where the thickness of the damaged layer is smaller than 2 μm, the gettering effect owing to the damaged layer is weak, and the defect densities scarcely differ between in the area with the ground damaged layer of the rear surface left behind and in the area with the damaged layer of the rear surface removed.

Accordingly, the thickness of the damaged layer by the grinding should preferably be 2 μm or greater.

Figure 5:
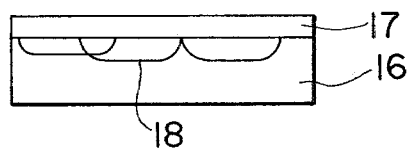
FIG. 5 is a schematic diagram for explaining the dislocation which is developed from a ground damaged layer by a heat treatment.

A Si semiconductor device is manufactured via high-temperature heat-treatment steps such as oxidation, epitaxial growth and impurity diffusion. When the wafer subjected to the grinding is heat-treated, a dislocation develops from the damaged layer. The situation is illustrated in FIG. 5. A sample 16 was ground with grains #400, and the thickness of a damaged layer 17 was 22 μm. When the sample was heat-treated in an oxygen atmosphere at 1,000° C. for 10 minutes, a dislocation 18 appeared.

Figure 6:
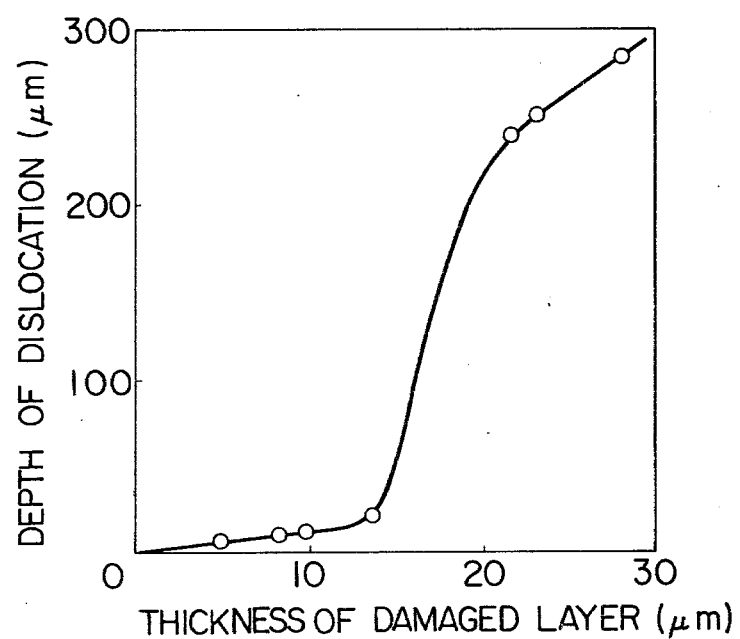
FIG. 6 is a graph showing the relationship between the depth of the dislocation developed from the damaged layer by the heat treatment and the thickness of the damaged layer.

FIG. 6 illustrates the relationship between the depth of the dislocation appearing after the heat treatment was conducted at 1,000° C. for 10 minutes, and the thickness of the damaged layer before conducting the heat treatment. When the thickness of the damaged layer exceeds 15 μm, the dislocation abruptly becomes deep, and even a dislocation which extends from the rear surface to the front surface of the wafer arises. When the dislocation exists in the active region or layer (at a depth on the order of several hundreds A-10 μm from the front surface) of the device, it exerts evil effects on the electrical characteristics of a transistor such as reverse breakdown voltage. Accordingly, the thickness of the damaged layer by the grinding should preferably be 15 μm or less. However, in case where a very thin layer (of 0.5 μm or so) of the surface is removed by etching, the thickness of the damaged layer by the grinding may be 20 μm or less.

Figure 7:
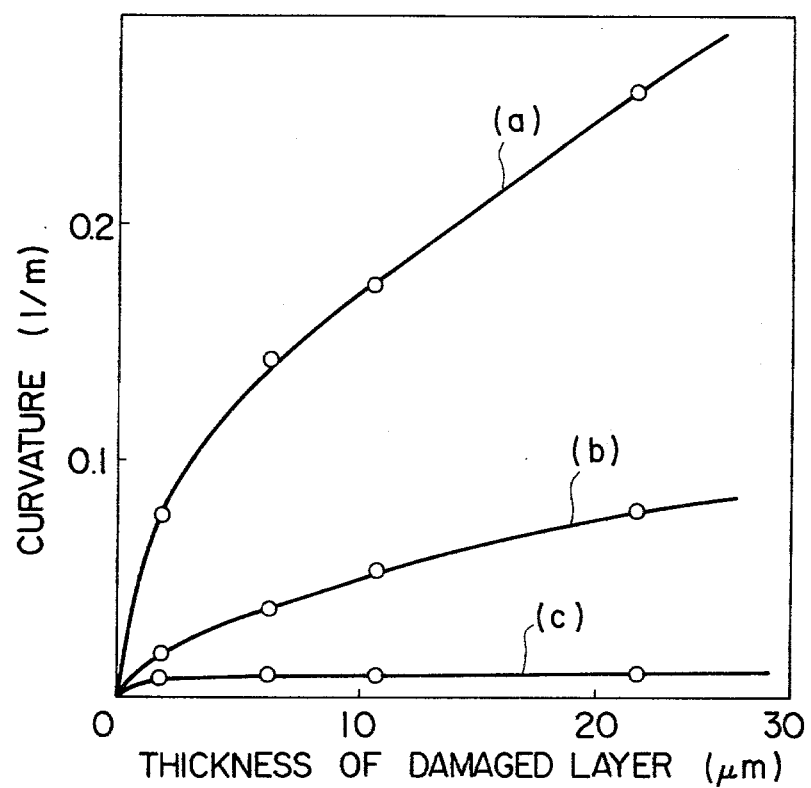
FIG. 7 is a graph showing the relationships between the curvature of a silicon wafer having a ground damaged layer and various treatments.

Further, when the ground layer exists in only one surface of the wafer, the wafer greatly curves with the ground surface being convex. (a) in FIG. 7 illustrates the relationship between the curvature of the wafer and the thickness of the damaged layer. The great curve of the wafer gives rise to cracks in the wafer at the step of mirror polishing, and forms a cause for a non-uniform thickness of the wafer. When the damaged layer of the ground wafer is etched 0.5 μm, the curvature decreases conspicuously as shown at (b) in FIG. 7. When the wafer is further subjected to thermal oxidation at 1,000° C. for 80 minutes after the etching, the curvature becomes nearly zero as shown at (c) in FIG. 7.

By putting into a mirror surface the surface of a wafer whose curvature was reduced by the above method, the cracks and undulations of the wafer decreased drastically as compared with those in the case of mirror-polishing the surface immediately after the grinding.

Even when the heat treatment is carried out immediately after the grinding, the curvature becomes almost zero. However, foreign matters such as Si residue having entered the surface to-be-processed scatter during the heat treatment and form the cause of the contamination of the crystal. It is therefore favorable to etch the surface to-be-processed before the heat treatment.

In this invention, the thickness of the damaged layer formed by the grinding was measured by a method to be described below.

Figure 8A:
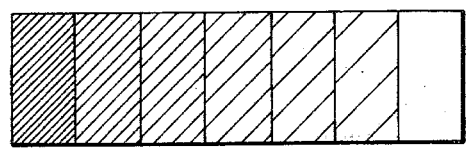
FIG. 8 is a diagram showing measured results of the thickness of a ground damaged layer.
Figure 8B:
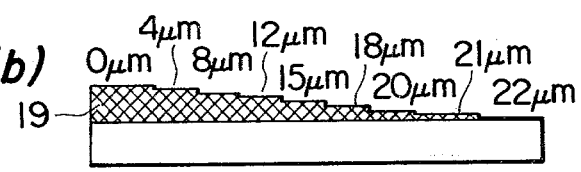

The surface layer of a Si wafer subjected to the grinding was etched stepwise (the etchant was a mixed solution consisting of nitric acid and fluoric acid at a proportion of 20 to 1, for example), and the depth at which crystal defects disappeared was evaluated by the use of the X-ray topography, whereby the thickness of the damaged layer was measured. FIG. 8 illustrates an example of the measured result of the thickness of the damaged layer of the wafer. (A) in FIG. 8 is a schematic sectional view of the wafer, and numerical values over stepped parts in (B) of FIG. 8 indicated the etched amounts of the respective parts by way of example. The size of the grains of a grindstone employed for the grinding was Mesh #400. As apparent from the figure, when the ground surface layer was etched 22 μm, the damaged layer 19 was removed (B in FIG. 8), and a defect image (hatched) vanished on the X-ray topograph of the sample wafer (A in FIG. 8). It was thus known that the thickness of the damaged layer in this sample was 22 μm. In this manner, the "thickness of the damaged layer" stated in this invention signifies the depth at which the defect image based on the damaged layer vanishes.

Figure 9:
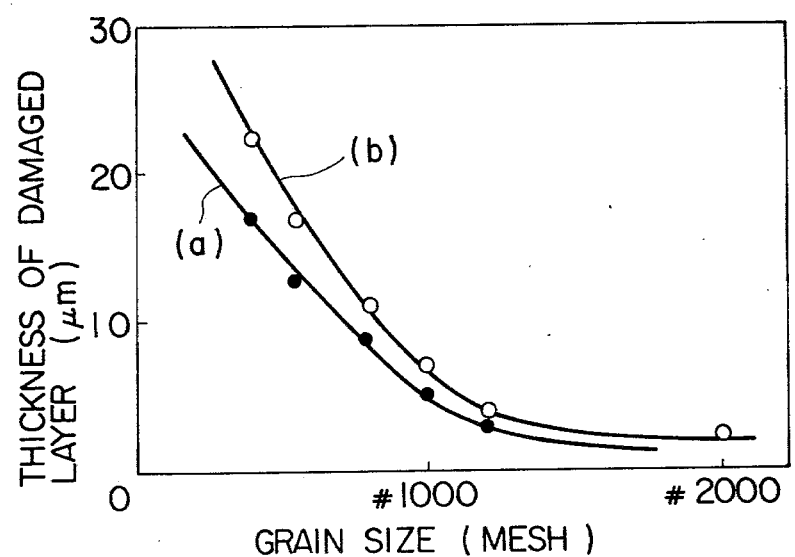
FIG. 9 is a graph showing the relationship between the thickness of a ground damaged layer and the grain size.

The relationship between the thickness of a damaged layer measured with the above method and the size of grains is illustrated in FIG. 9. The thickness of the damaged layer becomes greater as the grain size becomes larger. The thickness of the damaged layer depends upon the face orientation of a Si wafer. The thickness (a) of the damaged layer of a wafer of face orientation (111) is 0.8 times that (b) in the case of a wafer of face orientation (100).

As set forth above, according to this invention, in semiconductor manufacturing processes for a Si single crystal wafer etc., before the step of mirror polishing, the rear surface of a Si wafer is ground to form a damaged layer whose thickness lies in a range of 2 μm to 20 μm, desirably 2 μm to 15 μm, the Si wafer is subsequently etched by the chemical etching, and an oxide film is further formed on the rear surface by the thermal oxidation, whereby a semiconductor substrate having an intense gettering effect can be manufactured.

Depending upon the required characteristics etc. of a semiconductor device aimed at, either or both of the etching of the ground surface and the heat treatment of the wafer after the grinding may be omitted in the working process of this invention shown in FIG. 1.

This invention is not restricted to the foregoing embodiments, and not to the concrete examples of the etchants etc. as well as the concrete numerical values of the heat treatment temperature, time etc. mentioned in the explanation and the example of the surface grinding as well as the conditions of the grinding stated previously, either, but various aspects of performance and various values can be appropriately set and selected in dependence on the required characteristics etc. of semiconductor devices aimed at.

I claim:

1. A method of manufacturing a semiconductor substrate comprising the step of cutting a semiconductor crystal rod into the shape of a wafer, to obtain a semiconductor wafer, the step of grinding a rear surface of said semiconductor wafer with plane wheel means, to form a damaged layer whose maximum depth lies in a range of 2 μm to 20 μm in the rear surface, the step of etching the ground surface to decrease the curvature of said semiconductor wafer, and the step of mirror-polishing a front surface of the semiconductor wafer.

2. A method of manufacturing a semiconductor substrate according to claim 1, wherein the semiconductor wafer is heat-treated for oxidation after the etching step.

3. A method of manufacturing a semiconductor substrate according to claim 1 or 2, wherein said semiconductor substrate is a silicon single crystal substrate.

4. A method of manufacturing a semiconductor substrate according to claim 1 or 2 wherein said semiconductor substrate is provided with a semiconductor epitaxial growth layer thereon.

5. A method of manufacturing a semiconductor substrate according to claim 1, wherein said semiconductor substrate is provided with at least one semiconductor device thereon.

6. A method of manufacturing a semiconductor substrate according to claim 1 wherein the grinding step forms the damaged layer of a maximum depth of 2 μm to 15 μm in the rear surface of said semiconductor substrate.

7. A method of manufacturing a semiconductor substrate according to claim 1 or 2 wherein the grinding step is carried out with plane wheel means of less than a grit size of 2000.

8. A method of manufacturing a semiconductor substrate according to claim 3, wherein said semiconductor substrate is provided with a semiconductor epitaxial growth layer thereon.

9. A method of manufacturing a semiconductor substrate according to claim 3, wherein said semiconductor substrate is provided with at least one semiconductor device thereon.

10. A method of manufacturing a semiconductor substrate according to claim 3, wherein the grinding step forms the damaged layer of a maximum depth of 2 μm to 15 μm in the rear surface of said semiconductor substrate.

11. A method of manufacturing a semiconductor substrate according to claim 3, wherein the grinding step is carried out with plane wheel means of less than a grit size of 2000.

* * * * *